United States Patent
Liu et al.

(10) Patent No.: US 10,629,718 B2
(45) Date of Patent: Apr. 21, 2020

(54) III-NITRIDE EPITAXIAL STRUCTURE

(71) Applicant: GlobalWafers Co., Ltd., Hsinchu (TW)

(72) Inventors: Jia-Zhe Liu, Hsinchu (TW); Yen-Lun Huang, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/198,774

(22) Filed: Nov. 22, 2018

(65) Prior Publication Data

US 2020/0098907 A1    Mar. 26, 2020

(30) Foreign Application Priority Data

Sep. 20, 2018   (TW) .............................. 107133264 A

(51) Int. Cl.
*H01L 29/778*   (2006.01)
*H01L 29/20*    (2006.01)
*H01L 29/205*   (2006.01)

(52) U.S. Cl.
CPC ...... *H01L 29/7784* (2013.01); *H01L 29/2003* (2013.01); *H01L 29/205* (2013.01)

(58) Field of Classification Search
CPC ............. H01L 29/7784; H01L 29/2003; H01L 29/205
See application file for complete search history.

(56) References Cited

U.S. PATENT DOCUMENTS

| | | | | |
|---|---|---|---|---|
| 7,253,454 | B2 * | 8/2007 | Saxler | H01L 29/1029 257/194 |
| 7,518,162 | B2 * | 4/2009 | Kuramoto | B82Y 20/00 257/101 |
| 8,410,552 | B2 | 4/2013 | Miyoshi et al. | |
| 2009/0318698 | A1 * | 12/2009 | Hartmann | C09K 11/06 546/4 |
| 2013/0181224 | A1 * | 7/2013 | Lim | H01L 29/7786 257/76 |
| 2015/0287806 | A1 * | 10/2015 | Liu | H01L 29/7786 438/172 |
| 2018/0301528 | A1 * | 10/2018 | Chen | H01L 29/0634 |
| 2019/0123546 | A1 * | 4/2019 | Wang | H02M 1/32 |

FOREIGN PATENT DOCUMENTS

| | | |
|---|---|---|
| CN | 102005470 | 4/2011 |
| EP | 2290675 | 3/2011 |
| JP | 5580009 | 8/2014 |

* cited by examiner

*Primary Examiner* — Ida M Soward
(74) *Attorney, Agent, or Firm* — JCIPRNET

(57) ABSTRACT

An epitaxial structure includes a substrate, a buffer layer, a channel layer, an intermediate layer, and a barrier layer. The buffer layer is disposed on the substrate, the channel layer is disposed on the buffer layer, the barrier layer is disposed on the channel layer, and the intermediate layer is disposed between the channel layer and the barrier layer. The chemical composition of the barrier layer is $Al_{x1}In_{y1}Ga_{z1}N$, and the chemical composition of the intermediate layer is $Al_{x2}In_{y2}Ga_{z2}N$. The lattice constant of the barrier layer is greater than the lattice constant of the intermediate layer. The aluminum (Al) content of at least a portion of the intermediate layer is greater than the Al content of the barrier layer.

21 Claims, 11 Drawing Sheets

III-NITRIDE EPITAXIAL STRUCTURE

CROSS-REFERENCE TO RELATED APPLICATION

This application claims the priority benefit of Taiwan application serial no. 107133264, filed on Sep. 20, 2018. The entirety of the above-mentioned patent application is hereby incorporated by reference herein and made a part of this specification.

BACKGROUND

Technical Field

This invention relates to a semiconductor structure, and more particularly, to an epitaxial structure.

Description of Related Art

Since semiconductor epitaxy has the advantages of high purity, good thickness control, etc., it has been widely used in radio-frequency (RF) devices or power devices.

A typical RF device consists of an epitaxial structure of a channel layer (such as GaN) and a barrier layer (such as AlGaN), and since the carrier limitation capability is limited, the two-dimensional electron gas (2DEG) produced by the polarization effect has a lower concentration.

Therefore, there is currently a method in which indium (In) is added in the barrier layer to alleviate the above issue. However, the inclusion of indium in the barrier layer increases the interface roughness, such that interface roughness and the FWHM and intensity of the XRD diffraction peak are worse, thus resulting in poor electron mobility, and therefore the phenomenon of electrical degradation of the device occurs.

SUMMARY

The invention provides an epitaxial structure with improved two-dimensional electron gas characteristics so as to improve the operating characteristics of a device.

An epitaxial structure of the invention includes a substrate, a buffer layer, a channel layer, an intermediate layer, and a barrier layer. The buffer layer is disposed on the substrate, the channel layer is disposed on the buffer layer, the barrier layer is disposed on the channel layer, and the intermediate layer is disposed between the channel layer and the barrier layer. The chemical composition of the barrier layer is $Al_{x1}In_{y1}Ga_{z1}N$, and the chemical composition of the intermediate layer is $Al_{x2}In_{y2}Ga_{z2}N$. The lattice constant of the barrier layer is greater than the lattice constant of the intermediate layer. The aluminum (Al) content of at least a portion of the intermediate layer is greater than the Al content of the barrier layer.

In an embodiment of the invention, the aluminum content of the barrier layer is a fixed value, such as 10% to 30%.

In an embodiment of the invention, the aluminum content of the barrier layer may be linearly reduced along the growth direction of the epitaxial structure.

In an embodiment of the invention, the initial content of the aluminum content of the barrier layer is 10% to 50%, the end content thereof is 0% to 20%, and the gradient slope thereof is −1%/nm to −20%/nm.

In an embodiment of the invention, the aluminum content of the intermediate layer is a fixed value, such as greater than 30%.

In an embodiment of the invention, the aluminum content of the intermediate layer is linearly reduced along the growth direction of the epitaxial structure, and the initial content of the aluminum content of the intermediate layer is 50% to 100%, the end content thereof is 10% to 50%, and the gradient slope thereof is −10%/nm to −50%/nm.

In an embodiment of the invention, the aluminum content of the intermediate layer is linearly increased along the growth direction of the epitaxial structure, and the initial content of the aluminum content of the intermediate layer is 0% to 50%, the end content thereof is 50% to 100%, and the gradient slope thereof is 10%/nm to 50%/nm.

In an embodiment of the invention, the aluminum content of the intermediate layer is increased stepwise along the growth direction of the epitaxial structure, and the initial content of the aluminum content of the intermediate layer is 0% to 50%, the end content thereof is 50% to 100%, and the step slope thereof is 10%/loop to 50%/loop.

In an embodiment of the invention, the aluminum content of the intermediate layer is reduced stepwise along the growth direction of the epitaxial structure, and the initial content of the aluminum content of the intermediate layer is 50% to 100%, the end content thereof is 0% to 50%, and the step slope thereof is −10%/loop to −50%/loop.

In an embodiment of the invention, along the growth direction of the epitaxial structure, the aluminum content of the intermediate layer is composed of alternating fixed regions and gradient regions, and the aluminum contents of the fixed regions are fixed values, and the aluminum contents of the gradient regions are linearly increased. The initial content of the aluminum content of the intermediate layer is 0% to 50%, the end content thereof is 50% to 100%, and the gradient slope of the aluminum contents of the gradient regions is 10%/nm to 50%/nm and the step slope of the fixed regions is 10%/loop to 50%/loop.

In an embodiment of the invention, along the growth direction of the epitaxial structure, the aluminum content of the intermediate layer is composed of alternating fixed regions and gradient regions, and the aluminum contents of the fixed regions are fixed values, and the aluminum contents of the gradient regions are linearly reduced. The initial content of the aluminum content of the intermediate layer is 50% to 100%, the end content thereof is 0% to 50%, and the gradient slope of the aluminum contents of the gradient regions is −10%/nm to −50%/nm and the step slope of the fixed regions is −10%/loop to −50%/loop.

In an embodiment of the invention, along the growth direction of the epitaxial structure, the aluminum content of the intermediate layer is composed of a plurality of fixed regions, and the aluminum contents of adjacent fixed regions are different fixed values, wherein the lower of the aluminum contents in the fixed regions is 0% to 50%, the higher thereof is 50% to 100%, and the step slope of the fixed regions is ±10%/loop to ±50%/loop.

In an embodiment of the invention, along the growth direction of the epitaxial structure, the aluminum content of the intermediate layer is composed of a plurality of fixed regions and a plurality of gradient regions, each of the gradient regions is disposed between two fixed regions, and the aluminum contents of two adjacent fixed regions of each of the gradient regions are different fixed values. The lower of the aluminum contents in the fixed regions is 0% to 50%, and the higher thereof is 50% to 100%, the step slope of the fixed regions is ±10%/loop to ±50%/loop, and the gradient slopes of the gradient regions are 10%/nm to 50%/nm and −10%/nm to −50%/nm.

In an embodiment of the invention, the epitaxial structure may further include a nucleation layer disposed between the substrate and the buffer layer.

In an embodiment of the invention, the roughness (rms) of the surface of the intermediate layer in contact with the barrier layer is less than 5 nm.

Based on the above, in the invention, the electron mobility is increased by providing an intermediate layer having a specific aluminum content variation between the channel layer and the barrier layer, and the 2DEG characteristics are improved by increasing the carrier limitation capability, and the interface quality and surface roughness of the epitaxial structure may also be improved.

To make the aforementioned more comprehensible, several embodiments accompanied with drawings are described in detail as follows

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
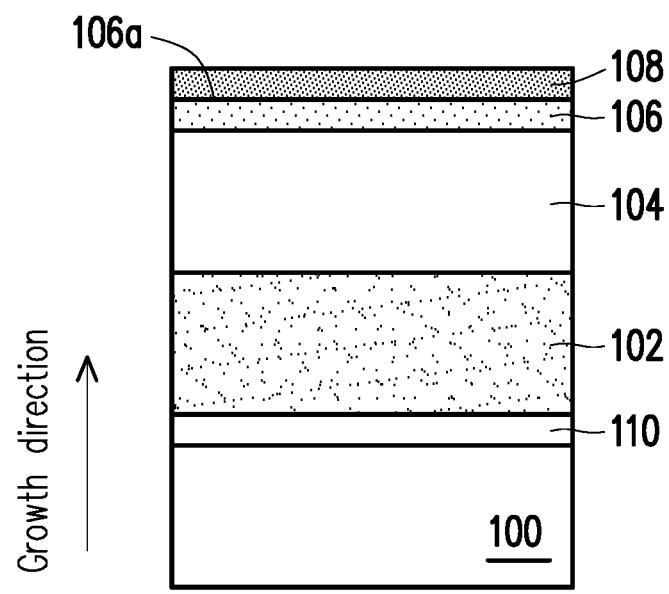
FIG. 1 is a cross section of an epitaxial structure according to an embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

FIG. 1 is a cross section of an epitaxial structure according to an embodiment of the invention.

Referring to FIG. 1, an epitaxial structure of the present embodiment includes a substrate 100, a buffer layer 102, a channel layer 104, an intermediate layer 106, and a barrier layer 108. The buffer layer 102 is disposed on the substrate 100, the channel layer 104 is disposed on the buffer layer 102, the barrier layer 108 is disposed on the channel layer 104, and the intermediate layer 106 is disposed between the channel layer 104 and the barrier layer 108. The chemical composition of the barrier layer 108 is $Al_{x1}In_{y1}Ga_{z1}N$, wherein $x1+y1+z1=1$, $0 \leq x1 \leq 0.3$, and $0.3 \leq y1 \leq 0.7$. The chemical composition of the intermediate layer 106 is $Al_{x2}In_{y2}Ga_{z2}N$, wherein $x2+y2+z2=1$, $0.5 \leq x2 \leq 1$, and $0 \leq y2 \leq 0.5$. x1 and x2 represent Al (aluminum) content, y1 and y2 represent In (indium) content, and z1 and z2 represent Ga (gallium) content. The lattice constant of the barrier layer 108 is greater than the lattice constant of the intermediate layer 106. The aluminum content of at least a portion of the intermediate layer 106 of the present embodiment may be greater than the aluminum content of the barrier layer 108; for example, the aluminum content of the entire intermediate layer 106 is greater than the aluminum content of the barrier layer 108, but the invention is not limited thereto. The aluminum content variation of the intermediate layer 106 is detailed below.

Referring further to FIG. 1, the material of the substrate 100 is, for example, a Si, $Al_2O_3$, SiC, GaAs, SOI (silicon on insulator) substrate or other suitable materials. The material of the buffer layer 102 is, for example, aluminum nitride (AlN) or the like. The thickness of the buffer layer 102 is typically greater than 500 nm. The material of the channel layer 104 is, for example, gallium nitride (GaN), aluminum nitride (AlN), indium nitride (InN), aluminum gallium indium nitride (AlGaInN), or the like. In the present embodiment, the band gap energy of the barrier layer 108 is smaller than the band gap energy of the intermediate layer 106. Moreover, in order to reduce the stress of the epitaxial structure, adjust the warpage of the epitaxial structure after epitaxial growth, or the like, a nucleation layer 110 may be disposed between the substrate 100 and the buffer layer 102, and the material thereof is, for example, AlInN or the like. In the present embodiment, the roughness (rms) of a surface 106a of the intermediate layer 106 in contact with the barrier layer 108 is less than 5 nm; preferably less than 2 nm. The thickness of the intermediate layer 106 is, for example, 1 nm to 20 nm, preferably 1 nm to 10 nm. The thickness of the barrier layer 108 is, for example, 1 nm to 50 nm, preferably 1 nm to 30 nm.

In the present embodiment, the electron mobility may be increased by the barrier layer 108 having a specific aluminum content variation and lower aluminum content, the 2DEG characteristics may be improved by increasing the carrier limitation capability, and the interface quality and surface roughness of the epitaxial structure may also be improved.

FIG. 2 to FIG. 17B are schematics showing various aluminum content variations of a portion of the epitaxial structure of the above embodiment along the growth direction, wherein the aluminum content variations of the channel layer 104, the intermediate layer 106, and the barrier layer 108 in the growth direction are shown, and the channel layer 104 in the figure is exemplified by aluminum-free gallium nitride (GaN).

Figure 2:
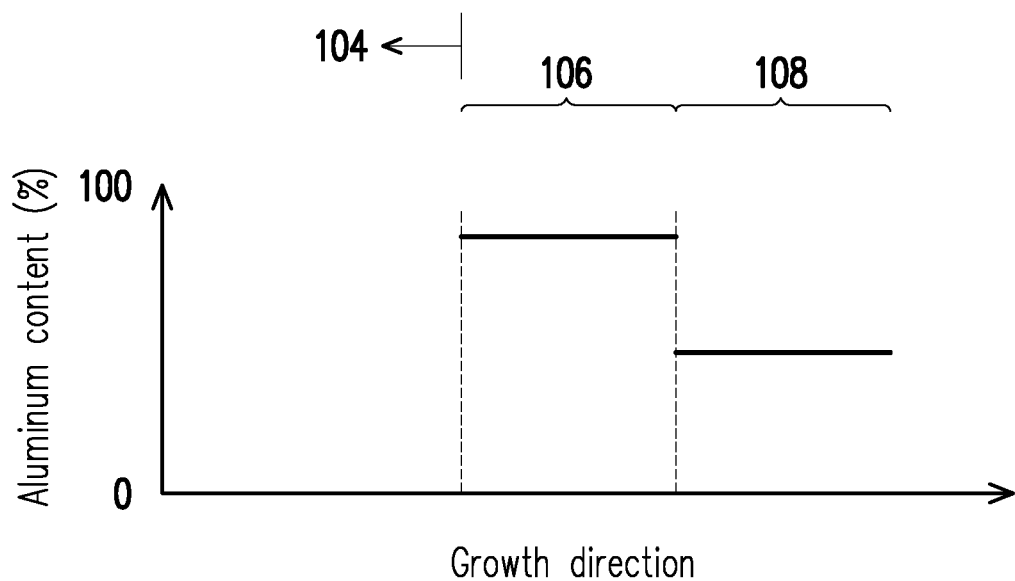
FIG. 2 is a schematic showing a first aluminum content variation of a portion of the epitaxial structure of the above embodiment along the growth direction.

In FIG. 2, the aluminum content of the barrier layer 108 is a fixed value (for example, 10% to 30%), the aluminum content of the intermediate layer 106 is also a fixed value (for example, more than 30%), and the aluminum content of the entire intermediate layer 106 is greater than the aluminum content of the barrier layer 108. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm. The lattice constant of the barrier layer 108 is greater than the lattice constant of the intermediate layer 106.

Figure 3:
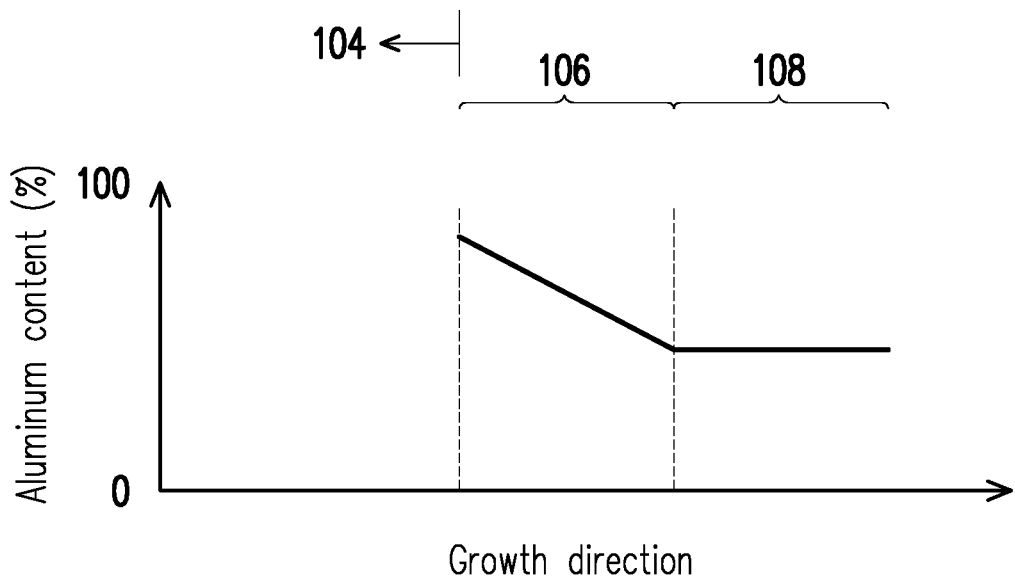
FIG. 3 is a schematic showing a second aluminum content variation of a portion of the epitaxial structure of the above embodiment along the growth direction.

In FIG. 3, the aluminum content of the barrier layer 108 is a fixed value (for example, 10% to 30%), and the aluminum content of the intermediate layer 106 is linearly reduced along the growth direction. The initial content of the aluminum content of the intermediate layer 106 is, for example, 50% to 100%, preferably 80% to 100%, and the end content thereof is, for example, 10% to 50%, preferably 20% to 30%. However, the invention is not limited thereto. The end content of the intermediate layer 106 may also be slightly lower than the aluminum content of the barrier layer 108. Moreover, the gradient slope of the aluminum content of the intermediate layer 106 is, for example, −10%/nm to −50%/nm, preferably −30%/nm to −50%/nm. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 4:
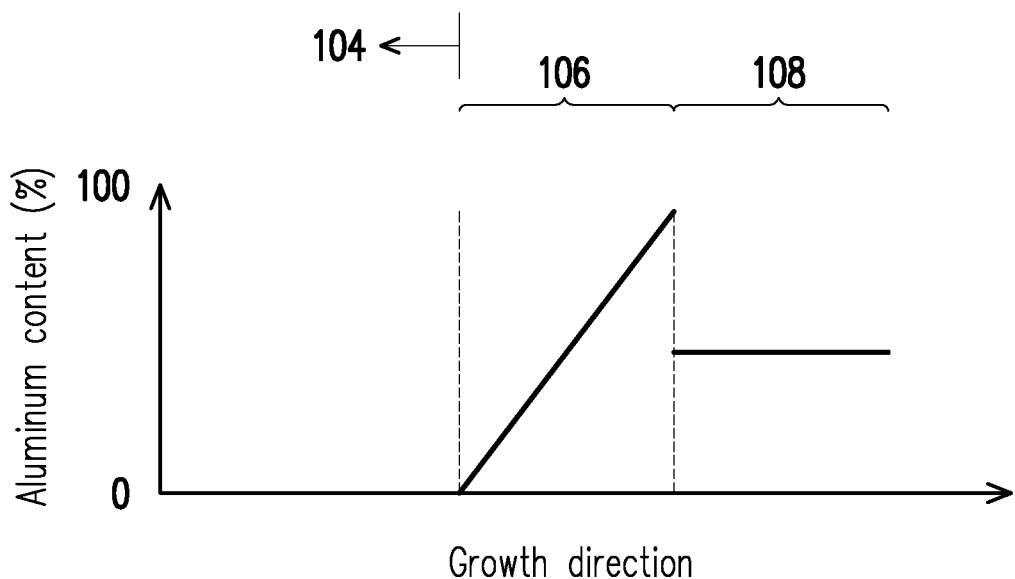
FIG. 4 is a schematic showing a third aluminum content variation of a portion of the epitaxial structure of the above embodiment along the growth direction.

In FIG. 4, the aluminum content of the barrier layer 108 is a fixed value (for example, 10% to 30%), and the aluminum content of the intermediate layer 106 is linearly increased along the growth direction. The initial content of the aluminum content of the intermediate layer 106 is, for example, 0% to 50%, preferably 0% to 30%, and the end content thereof is, for example, 50% to 100%, preferably 80% to 100%. Moreover, the gradient slope of the aluminum content of the intermediate layer 106 is, for example, 10%/nm to 50%/nm, preferably 30%/nm to 50%/nm. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 5:
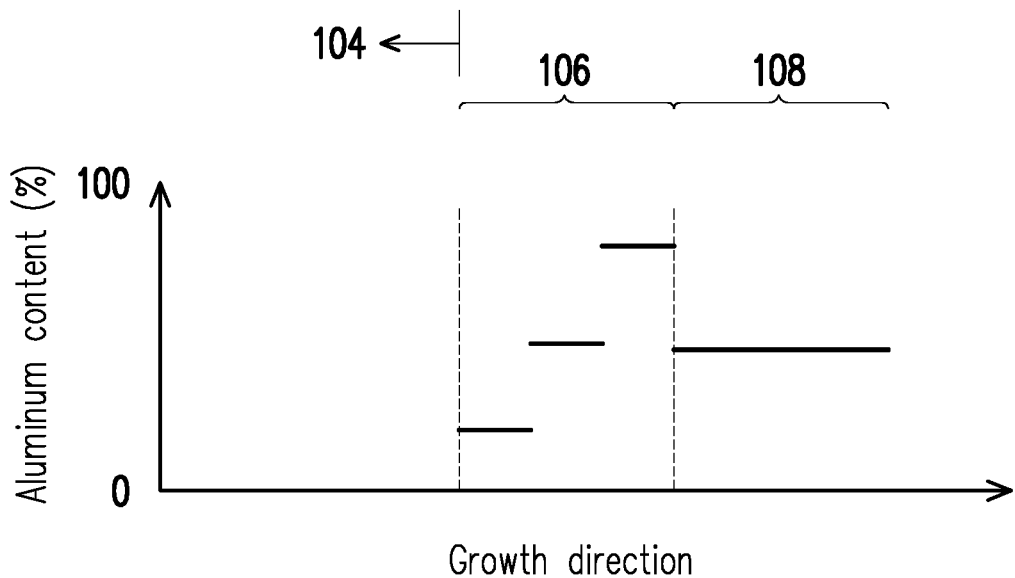
FIG. 5 is a schematic showing a fourth aluminum content variation of a portion of the epitaxial structure of the above embodiment along the growth direction.

In FIG. 5, the aluminum content of the barrier layer 108 is a fixed value (for example, 10% to 30%), and the aluminum content of the intermediate layer 106 is increased stepwise along the growth direction. The initial content of the aluminum content of the intermediate layer 106 is, for example, 0% to 50%, preferably 0% to 30%, and the end content thereof is, for example, 50% to 100%, preferably 70% to 100%. "Increased stepwise" means the aluminum content is gradually increased along the growth direction. For example, FIG. 5 has three step sections, the aluminum content in each step section is constant, and the number of steps may be 2 to 10 and the step slope may be 10%/loop to 50%/loop, preferably 30%/loop to 50%/loop. As used herein, the term "loop" refers to stacking via a method of having different amounts of fixed content, which in the invention represents the aluminum content variation of the entire intermediate layer 106. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 6:
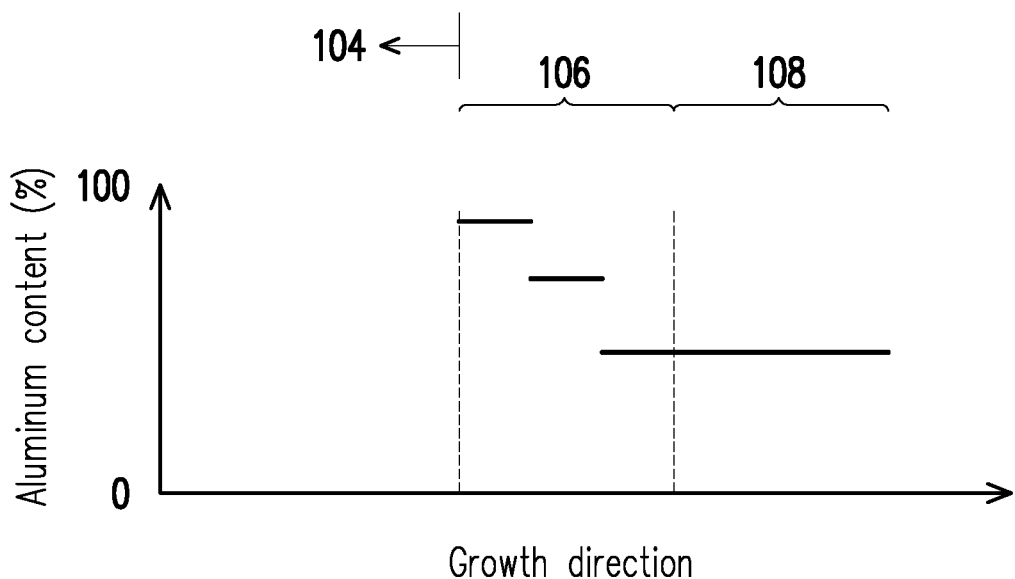
FIG. 6 is a schematic showing a fifth aluminum content variation of a portion of the epitaxial structure of the above embodiment along the growth direction.

In FIG. 6, the aluminum content of the barrier layer 108 is a fixed value (for example, 10% to 30%), and the aluminum content of the intermediate layer 106 is reduced stepwise in the growth direction. The initial content of the aluminum content of the intermediate layer 106 is, for example, 50% to 100%, preferably 70% to 100%, and the end content thereof is, for example, 0% to 50%, preferably 20% to 50%. "Reduced stepwise" means the aluminum content is gradually reduced along the growth direction. For example, FIG. 6 has three step sections, the aluminum content in each step section is constant, and the number of steps may be 2 to 10 and the step slope may be −10%/loop to −50%/loop, preferably −30%/loop to −50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 7:
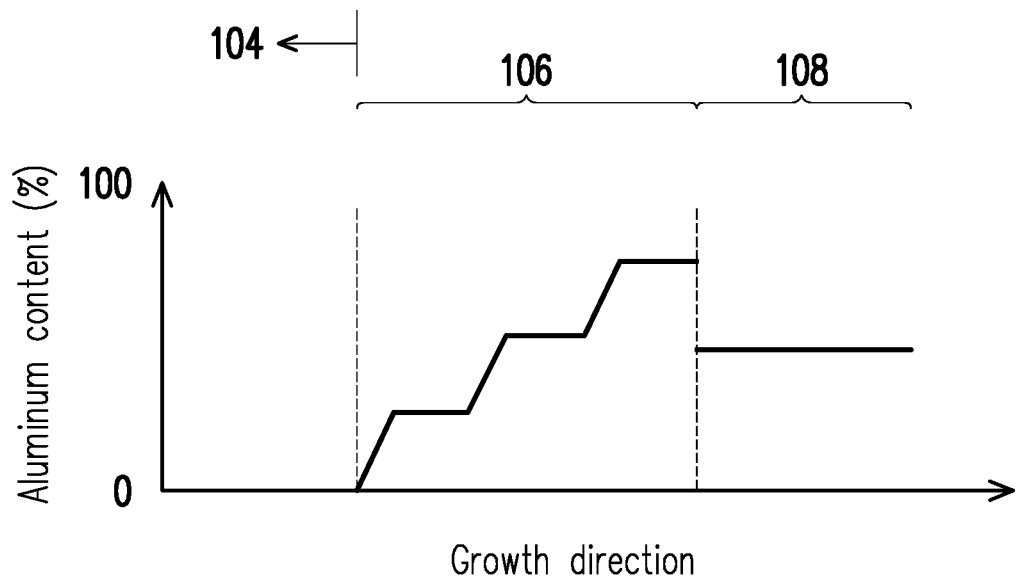
FIG. 7 is a schematic showing a sixth aluminum content variation of a portion of the epitaxial structure of the above embodiment along the growth direction.

In FIG. 7, the aluminum content of the barrier layer 108 is a fixed value (for example, 10% to 30%), the aluminum content of the intermediate layer 106 is composed of alternating fixed regions and gradient regions, and the aluminum contents of the fixed regions are fixed values, and the aluminum contents of the gradient regions are linearly increased. In the case of FIG. 7, the intermediate layer 106 includes three fixed regions and three gradient regions, and the fixed regions and the gradient regions are alternated with each other. The initial content of the aluminum content of the intermediate layer 106 is, for example, 0% to 50%, preferably 0% to 30%, and the end content thereof is, for example, 50% to 100%, preferably 70% to 100%. The gradient slope of the aluminum contents of the gradient regions of the intermediate layer 106 is, for example, 10%/nm to 50%/nm, preferably 30%/nm to 50%/nm. The number of steps of the fixed regions of the intermediate layer 106 may be 1 to 10 and the step slope thereof may be 10%/loop to 50%/loop, preferably 30%/loop to 50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 8:
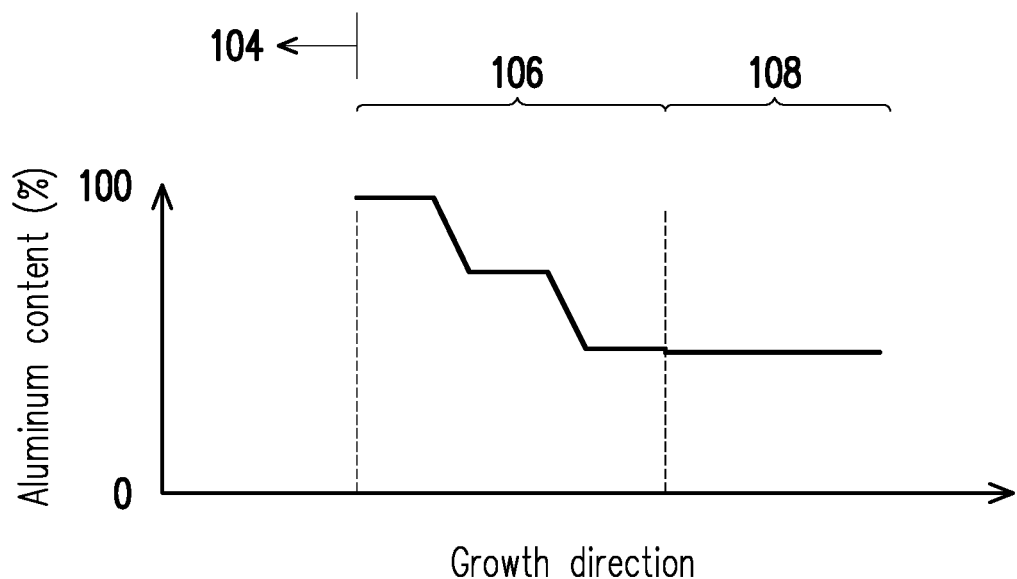
FIG. 8 is a schematic showing a seventh aluminum content variation of a portion of the epitaxial structure of the above embodiment along the growth direction.

In FIG. 8, the aluminum content of the barrier layer 108 is a fixed value (for example, 10% to 30%), the aluminum content of the intermediate layer 106 is composed of alternating fixed regions and gradient regions, and the aluminum contents of the fixed regions are fixed values, and the aluminum contents of the gradient regions are linearly reduced. In the case of FIG. 8, the intermediate layer 106 includes three fixed regions and two gradient regions, and the fixed regions and the gradient regions are alternated with each other. The initial content of the aluminum content of the intermediate layer 106 is, for example, 50% to 100%, preferably 70% to 100%, and the end content thereof is, for example, 0% to 50%, preferably 20% to 50%. The gradient slope of the aluminum contents of the gradient regions of the intermediate layer 106 is, for example, −10%/nm to −50%/nm, preferably −30%/nm to −50%/nm. The number of steps of the fixed regions of the intermediate layer 106 may be 1 to 10 and the step slope thereof may be −10%/loop to −50%/loop, preferably −30%/loop to −50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 9A:
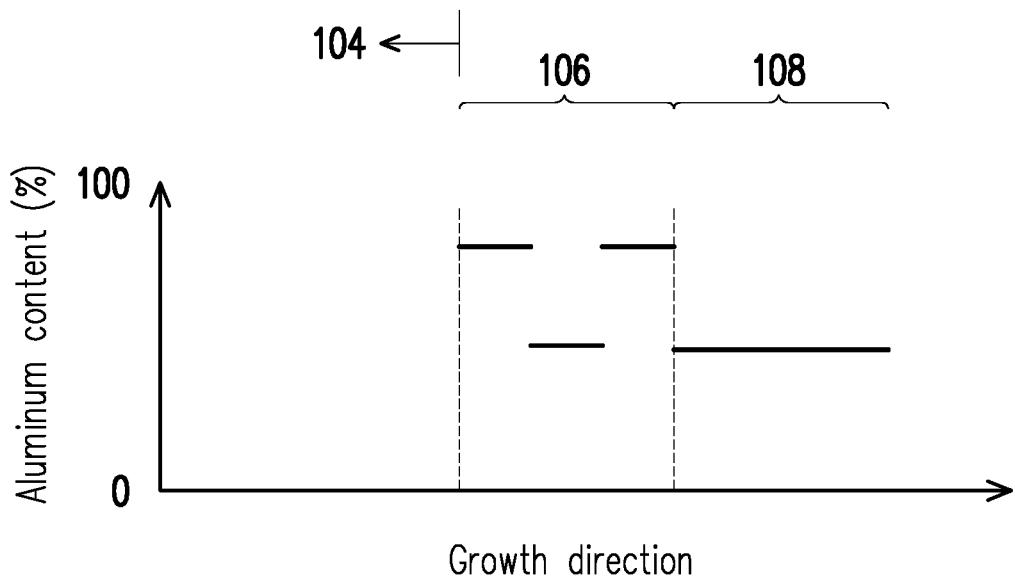
FIG. 9A is a schematic showing an eighth aluminum content variation of a portion of the epitaxial structure of the above embodiment along the growth direction.
Figure 9B:
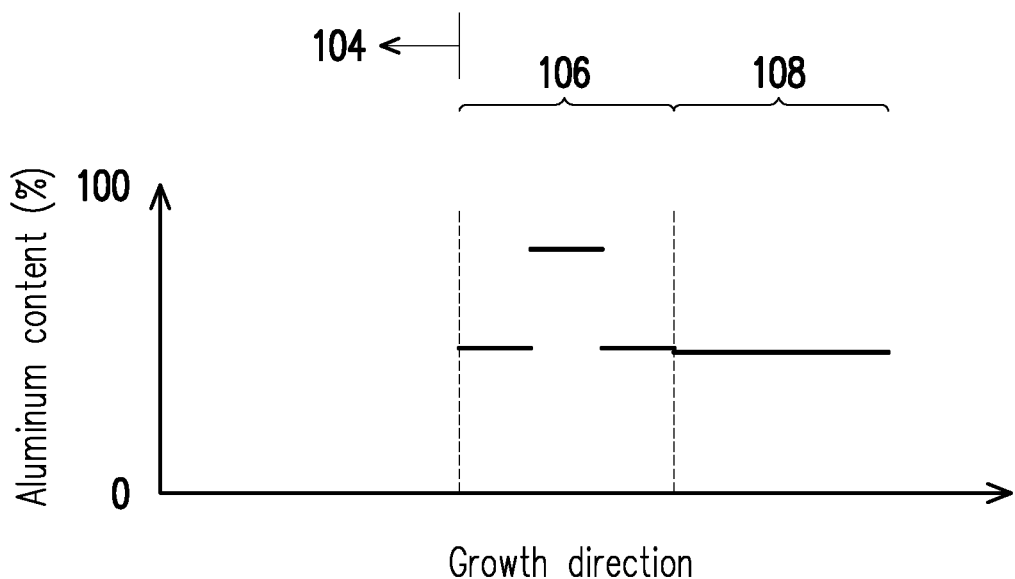
FIG. 9B is a schematic showing a ninth aluminum content variation of a portion of the epitaxial structure of the above embodiment along the growth direction.

In FIG. 9A and FIG. 9B, the aluminum content of the barrier layer 108 is a fixed value (for example, 10% to 30%), the aluminum content of the intermediate layer 106 is composed of a plurality of fixed regions, and the aluminum contents of adjacent fixed regions are different fixed values. In the case of FIG. 9A, the aluminum content of the intermediate layer 106 is composed of two higher fixed regions and a lower fixed region in the middle; and in the case of FIG. 9B, the aluminum content of the intermediate layer 106 is composed of two lower fixed regions and a higher fixed region in the middle. In particular, the lower value of the aluminum content of the intermediate layer 106 is, for example, 0% to 50%, preferably 20% to 50%, and the higher value of the aluminum content is, for example, 50% to 100%, preferably 70% to 100%. The number of steps of the fixed regions in FIG. 9A and FIG. 9B may be 1 to 10 and the step slope may be ±10%/loop to ±50%/loop, preferably ±30%/loop to ±50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 10A:
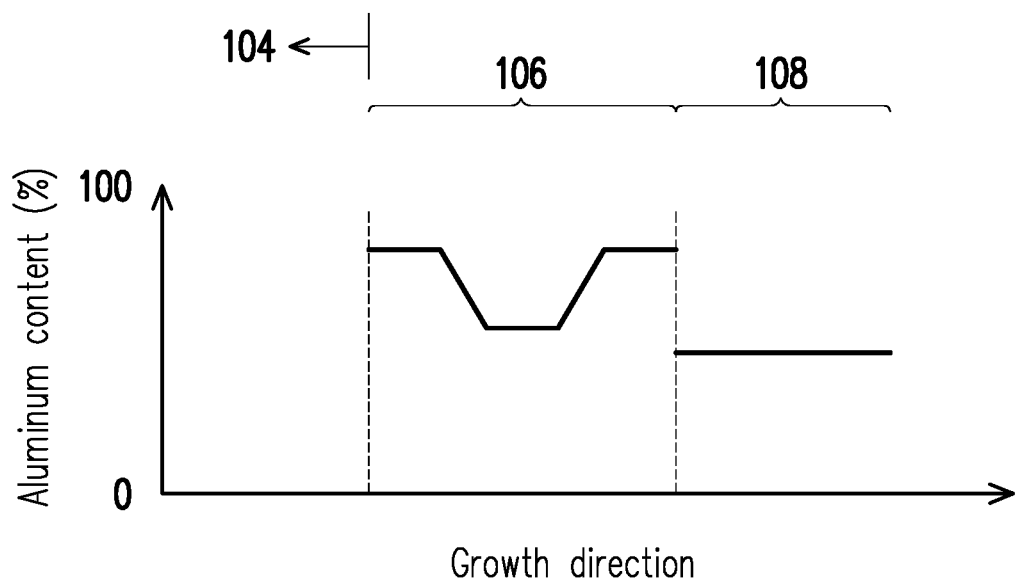
FIG. 10A is a schematic showing a tenth aluminum content variation of a portion of the epitaxial structure of the above embodiment along the growth direction.
Figure 10B:
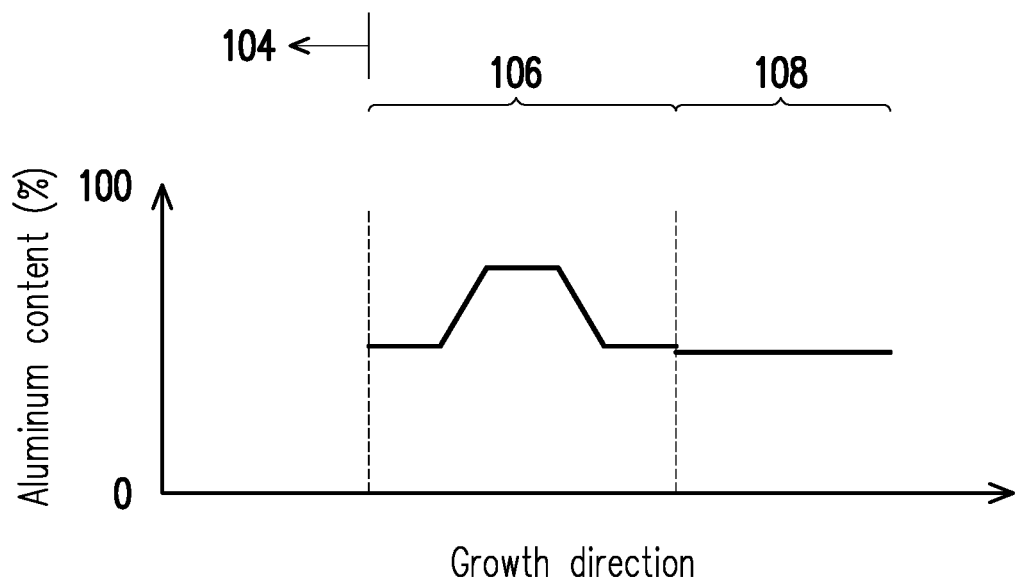
FIG. 10B is a schematic showing an eleventh aluminum content variation of a portion of the epitaxial structure of the above embodiment along the growth direction.

In FIG. 10A and FIG. 10B, the aluminum content of the barrier layer 108 is a fixed value (for example, 10% to 30%), the aluminum content of the intermediate layer 106 is composed of a plurality of fixed regions and a plurality of gradient regions, each of the gradient regions is disposed between two fixed regions, and the aluminum contents of two adjacent fixed regions of each of the gradient regions are different fixed values. In the case of FIG. 10A, the aluminum content of the intermediate layer 106 is composed of two higher fixed regions, one lower fixed region, and two gradient regions between different fixed regions. In the case of FIG. 10B, the aluminum content of the intermediate layer 106 is composed of two lower fixed regions, one higher fixed region, and two gradient regions between different fixed regions. In particular, the lower value of the aluminum content of the intermediate layer 106 is, for example, 0% to 50%, preferably 20% to 50%, and the higher value of the aluminum content is, for example, 50% to 100%, preferably 70% to 100%. The number of steps of the fixed regions in FIG. 10A and FIG. 10B may be 1 to 10 and the step slope may be ±10%/loop to ±50%/loop, preferably ±30%/loop to ±50%/loop. The gradient slopes of the gradient regions in FIG. 10A and FIG. 10B are, for example, 10%/nm to 50%/nm and −10%/nm to −50%/nm. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 11:
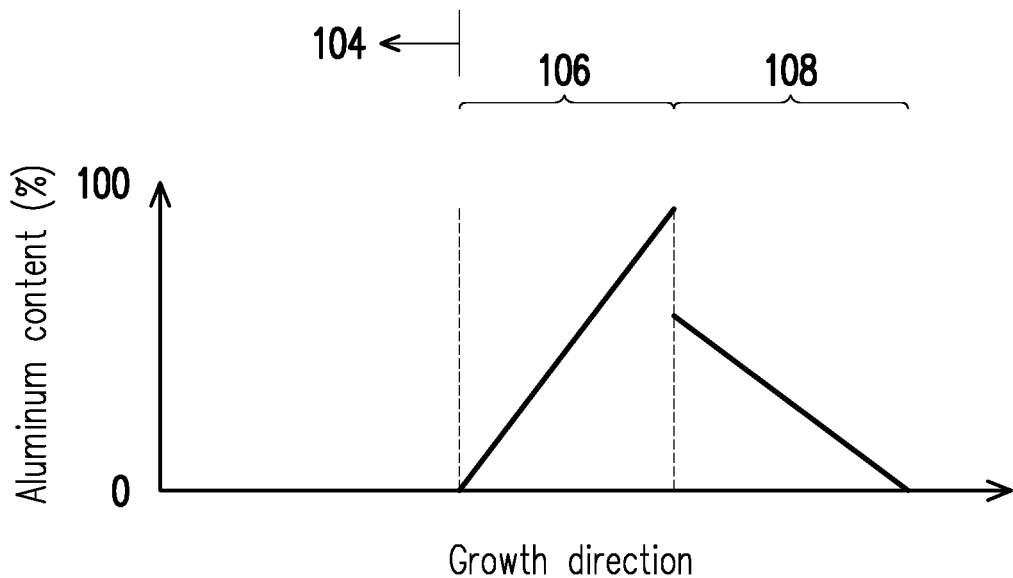
FIG. 11 is a schematic showing a twelfth aluminum content variation of a portion of the epitaxial structure of the above embodiment along the growth direction.

In FIG. 11, the aluminum content of the barrier layer 108 is linearly reduced along the growth direction, and the gradient slope of the aluminum content of the barrier layer 108 is, for example, −1%/nm to −20%/nm, preferably −1%/nm to −10%/nm. The initial content of the aluminum content of the barrier layer 108 is, for example, 10% to 50%, preferably 20% to 50%, and the end content thereof is, for example, 0% to 20%, preferably 0% to 10%. The aluminum content of the intermediate layer 106 is linearly increased along the growth direction. The initial content of the aluminum content of the intermediate layer 106 is, for example, 0% to 50%, preferably 30% to 50%, and the end content thereof is, for example, 50% to 100%, preferably 70% to 100%. Moreover, the gradient slope of the aluminum content of the intermediate layer 106 is, for example, 10%/nm to 50%/nm, preferably 20%/nm to 50%/nm. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 12:
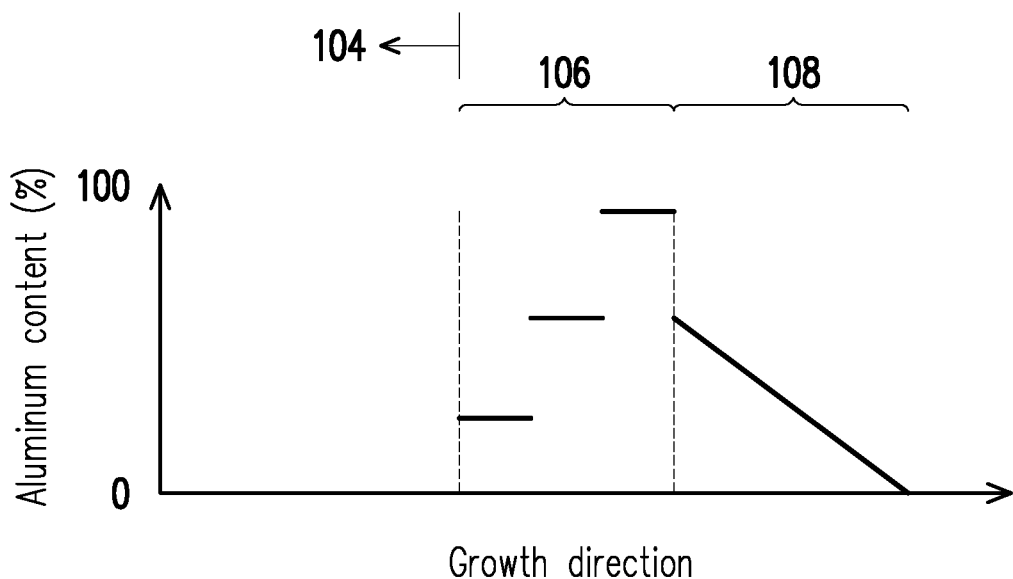
FIG. 12 is a schematic showing a thirteenth aluminum content variation of a portion of the epitaxial structure of the above embodiment along the growth direction.

In FIG. 12, the aluminum content of the barrier layer 108 is linearly reduced along the growth direction, and the gradient slope of the aluminum content of the barrier layer 108 is, for example, −1%/nm to −20%/nm, preferably −1%/nm to −10%/nm. The initial content of the aluminum content of the barrier layer 108 is, for example, 10% to 50%, preferably 10% to 30%, and the end content thereof is, for example, 0% to 20%, preferably 0% to 10%. The aluminum content of the intermediate layer 106 is increased stepwise along the growth direction. The initial content of the aluminum content of the intermediate layer 106 is, for example, 0% to 50%, preferably 10% to 50%, and the end content thereof is, for example, 50% to 100%, preferably 70% to 100%. In the case of FIG. 12, the aluminum content of the intermediate layer 106 has three step sections, the aluminum content in each step section is constant, and the number of steps may be 2 to 10 and the step slope may be 10%/loop to 50%/loop, preferably 20%/loop to 50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 13:
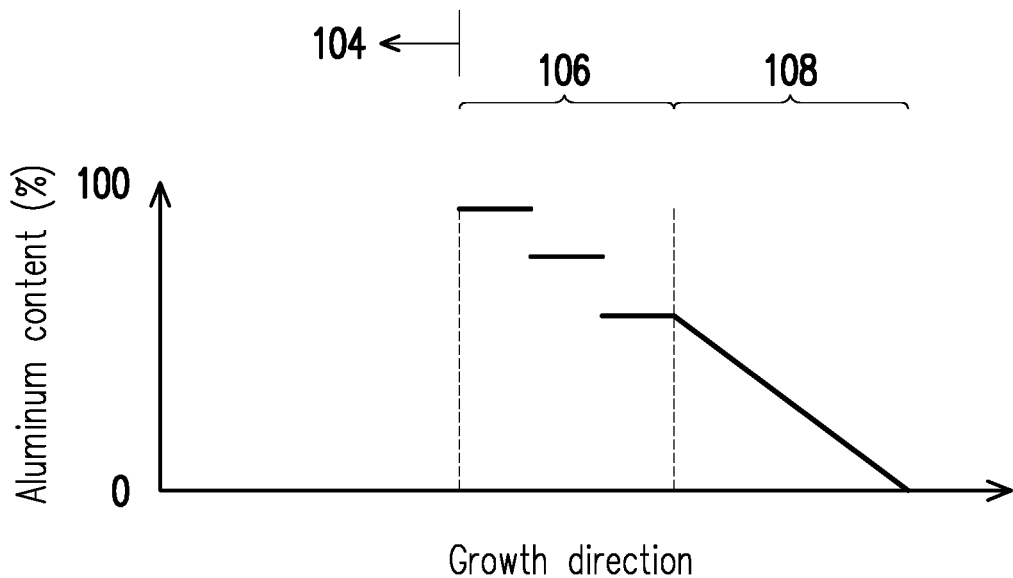
FIG. 13 is a schematic showing a fourteenth aluminum content variation of a portion of the epitaxial structure of the above embodiment along the growth direction.

In FIG. 13, the aluminum content of the barrier layer 108 is linearly reduced along the growth direction, and the gradient slope of the aluminum content of the barrier layer 108 is, for example, −1%/nm to −50%/nm, preferably −1%/nm to −20%/nm. The initial content of the aluminum content of the barrier layer 108 is, for example, 10% to 50%, preferably 10% to 30%, and the end content thereof is, for example, 0% to 20%, preferably 0% to 10%. The aluminum content of the intermediate layer 106 is reduced stepwise along the growth direction. The initial content of the aluminum content of the intermediate layer 106 is, for example, 50% to 100%, preferably 70% to 100%, and the end content thereof is, for example, 0% to 50%, preferably 20% to 50%. In the case of FIG. 13, the aluminum content of the intermediate layer 106 has three step sections, the aluminum content in each step section is constant, and the number of steps may be 2 to 10 and the step slope may be −10%/loop to −50%/loop, preferably −20%/loop to −50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 14:
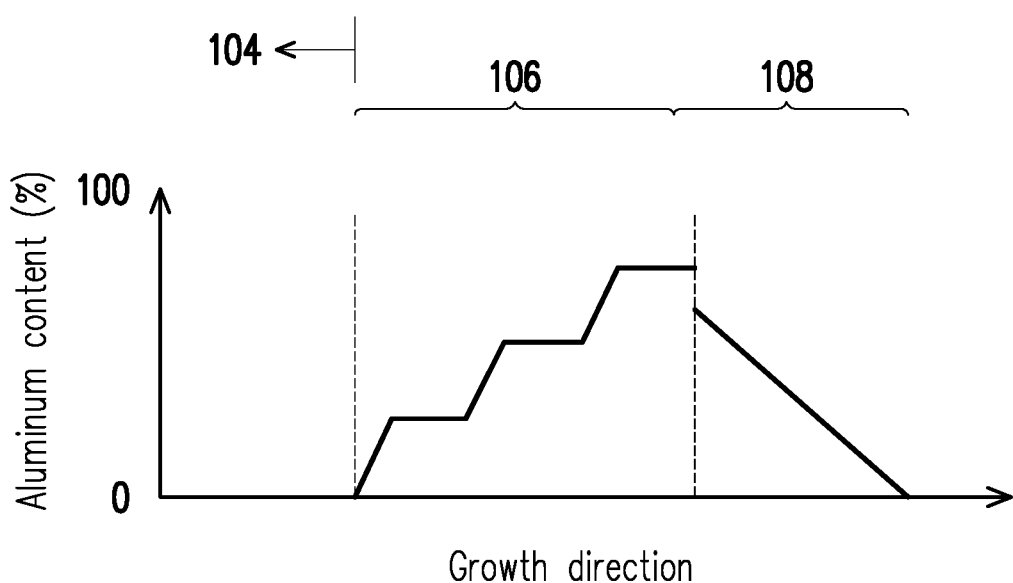
FIG. 14 is a schematic showing a fifteenth aluminum content variation of a portion of the epitaxial structure of the above embodiment along the growth direction.

In FIG. 14, the aluminum content of the barrier layer 108 is linearly reduced along the growth direction, and the gradient slope of the aluminum content of the barrier layer 108 is, for example, −1%/nm to −50%/nm, preferably −1%/nm to −20%/nm. The initial content of the aluminum content of the barrier layer 108 is, for example, 10% to 50%, preferably 10% to 30%, and the end content thereof is, for example, 0% to 30%, preferably 0% to 10%. The aluminum content of the intermediate layer 106 is composed of alternating fixed regions and gradient regions, and the aluminum contents of the fixed regions are fixed values, and the aluminum contents of the gradient regions are linearly increased. In the case of FIG. 14, the intermediate layer 106 includes three fixed regions and three gradient regions, and the fixed regions and the gradient regions are alternated with each other. The initial content of the aluminum content of the intermediate layer 106 is, for example, 0% to 50%, preferably 0% to 30%, and the end content thereof is, for example, 50% to 100%, preferably 70% to 100%. The aluminum contents of the gradient regions of the gradient regions of the intermediate layer 106 are, for example, 10%/nm to 50%/nm, preferably 20%/nm to 50%/nm. The number of steps of the fixed regions of the intermediate layer 106 may be 1 to 10 and the step slope thereof may be 10%/loop to 50%/loop, preferably 20%/loop to 50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 15:
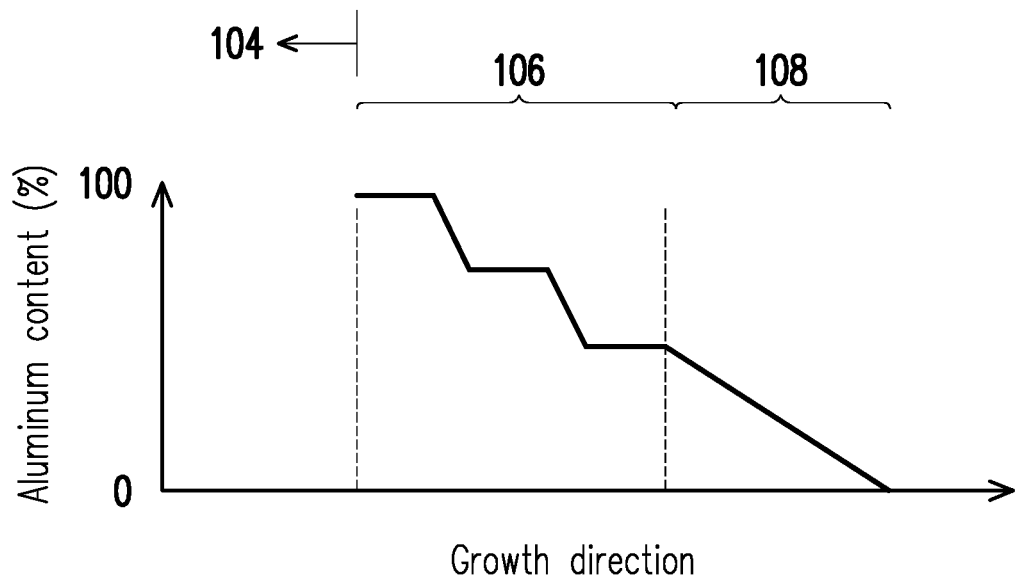
FIG. 15 is a schematic showing a sixteenth aluminum content variation of a portion of the epitaxial structure of the above embodiment along the growth direction.

In FIG. 15, the aluminum content of the barrier layer 108 is linearly reduced along the growth direction, and the gradient slope of the aluminum content of the barrier layer 108 is, for example, −1%/nm to −50%/nm, preferably −1%/nm to −20%/nm. The initial content of the aluminum content of the barrier layer 108 is, for example, 10% to 50%, preferably 10% to 30%, and the end content thereof is, for example, 0% to 30%, preferably 0% to 10%. The aluminum content of the intermediate layer 106 is composed of alternating fixed regions and gradient regions, and the aluminum contents of the fixed regions are fixed values, and the aluminum contents of the gradient regions are linearly reduced. In the case of FIG. 15, the intermediate layer 106 includes three fixed regions and two gradient regions, and the fixed regions and the gradient regions are alternated with each other. The initial content of the aluminum content of the intermediate layer 106 is, for example, 50% to 100%, preferably 70% to 100%, and the end content thereof is, for example, 0% to 50%, preferably 0% to 30%. The gradient slope of the aluminum contents of the gradient regions of the intermediate layer 106 is, for example, −10%/nm to −50%/nm, preferably −10%/nm to −30%/nm. The number of steps of the fixed regions of the intermediate layer 106 may be 1 to 10 and the step slope thereof may be −10%/loop to −50%/loop, preferably −10%/loop to −30%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm. Moreover, in an embodiment, if the end content of the aluminum content of the intermediate layer 106 is the initial content of the aluminum content of the barrier layer 108 such that the aluminum content of the interface between the intermediate layer 106 and the barrier layer 108 shows a continuous variation as shown in FIG. 15, then defect density may be reduced. As a result, not only are the quality of the epitaxial material and the flatness of the interface improved, but better carrier limitation capability may also be obtained.

Figure 16A:
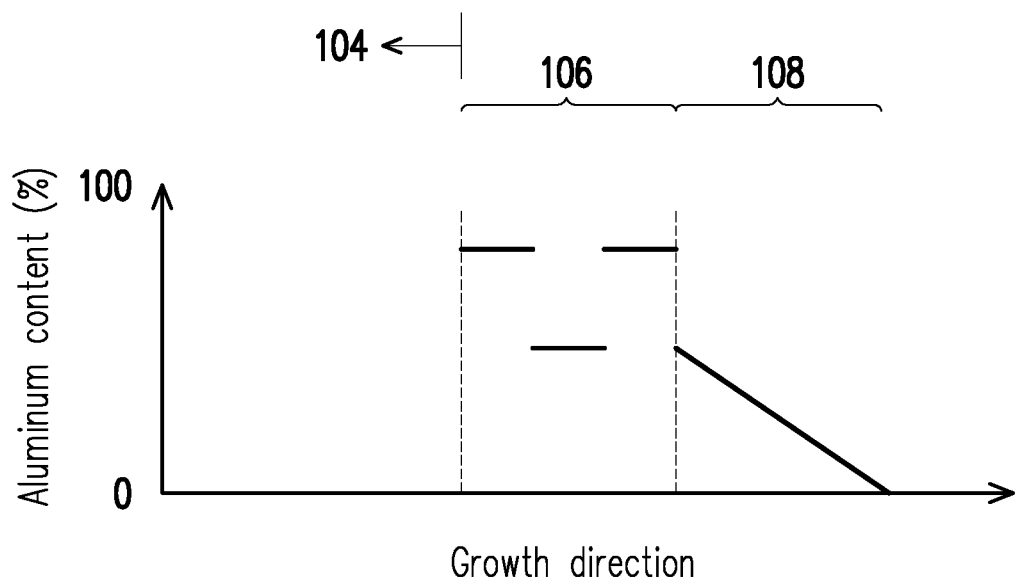
FIG. 16A is a schematic showing a seventeenth aluminum content variation of a portion of the epitaxial structure of the above embodiment along the growth direction.
Figure 16B:
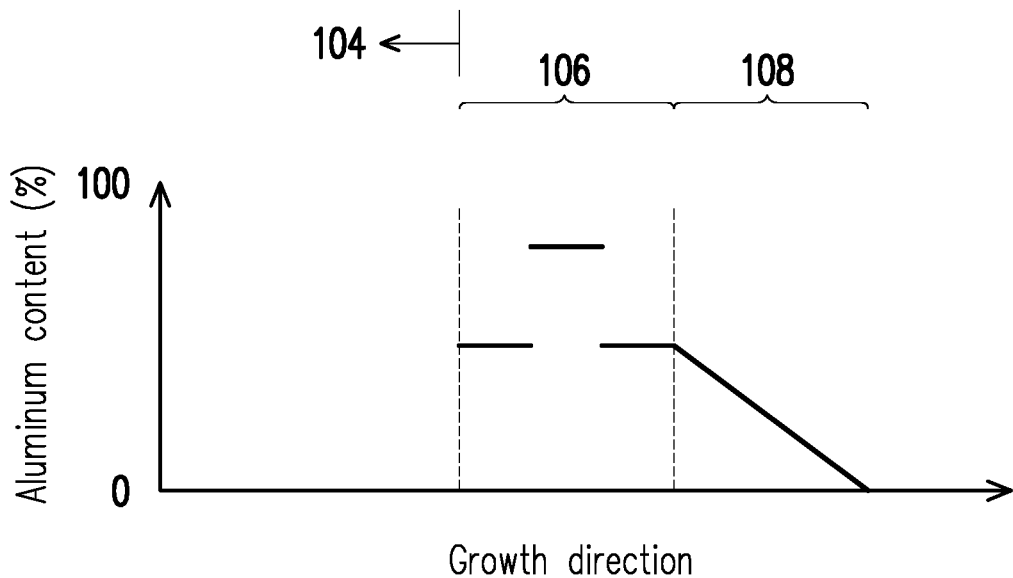
FIG. 16B is a schematic showing an eighteenth aluminum content variation of a portion of the epitaxial structure of the above embodiment along the growth direction.

In FIG. 16A and FIG. 16B, the aluminum content of the barrier layer 108 is linearly reduced along the growth direction, and the gradient slope of the aluminum content of the barrier layer 108 is, for example, −1%/nm to −50%/nm, preferably −1%/nm to −30%/nm. The initial content of the aluminum content of the barrier layer 108 is, for example, 10% to 50%, preferably 10% to 30%, and the end content thereof is, for example, 0% to 30%, preferably 0% to 10%. The aluminum content of the intermediate layer 106 is composed of a plurality of fixed regions, and the aluminum contents of adjacent fixed regions are different fixed values. In the case of FIG. 16A, the aluminum content of the intermediate layer 106 is composed of two higher fixed regions and a lower fixed region in the middle; and in the case of FIG. 16B, the aluminum content of the intermediate layer 106 is composed of two lower fixed regions and a higher fixed region in the middle. In particular, the lower value of the aluminum content of the intermediate layer 106 is, for example, 0% to 50%, preferably 2% to 50%, and the higher value of the aluminum content is, for example, 50% to 100%, preferably 70% to 100%. The number of steps of the fixed regions in FIG. 16A and FIG. 16B is 1 to 10 and the step slope may be ±10%/loop to ±50%/loop, preferably ±20%/loop to ±50%/loop. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Figure 17A:
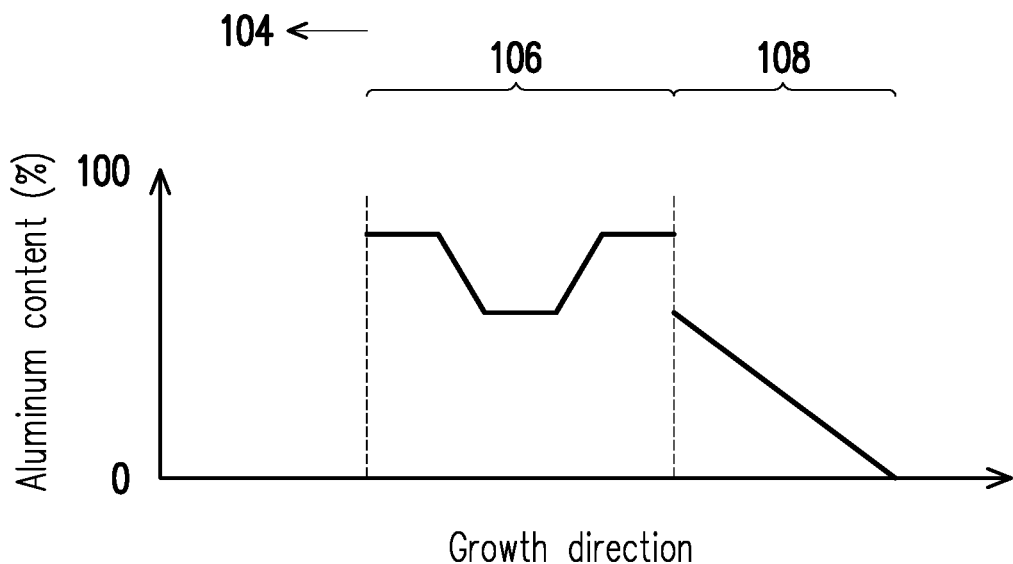
FIG. 17A is a schematic showing a nineteenth aluminum content variation of a portion of the epitaxial structure of the above embodiment along the growth direction.
Figure 17B:
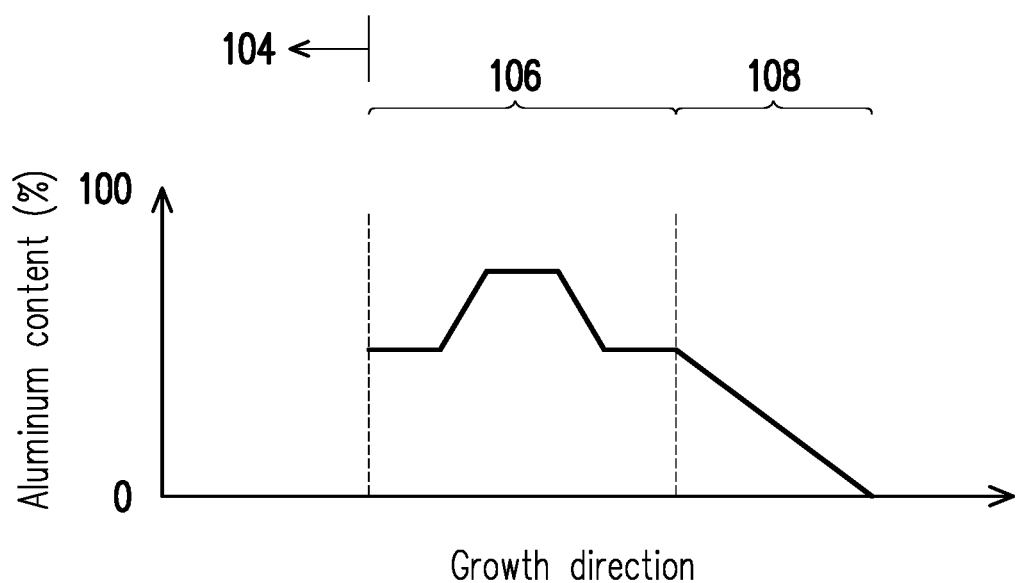
FIG. 17B is a schematic showing a twentieth aluminum content variation of a portion of the epitaxial structure of the above embodiment along the growth direction.

In FIG. 17A and FIG. 17B, the aluminum content of the barrier layer 108 is linearly reduced along the growth direction, and the gradient slope of the aluminum content of the barrier layer 108 is, for example, −1%/nm to −50%/nm, preferably −1%/nm to −20%/nm. The initial content of the aluminum content of the barrier layer 108 is, for example, 10% to 50%, preferably 10% to 30%, and the end content thereof is, for example, 0% to 30%, preferably 0% to 10%. The aluminum content of the intermediate layer 106 is composed of a plurality of fixed regions and a plurality of gradient regions, each of the gradient regions is disposed between two fixed regions, and the aluminum contents of two adjacent fixed regions of each of the gradient regions are different fixed values. In the case of FIG. 17A, the aluminum content of the intermediate layer 106 is composed of two higher fixed regions, one lower fixed region, and two gradient regions between different fixed regions. In the case of FIG. 17B, the aluminum content of the intermediate layer 106 is composed of two lower fixed regions, one higher fixed region, and two gradient regions between different fixed regions. In particular, the lower value of the aluminum content of the intermediate layer 106 is, for example, 0% to 50%, preferably 0% to 30%, and the higher value of the aluminum content is, for example, 50% to 100%, preferably 70% to 100%. The number of steps of the fixed regions in FIG. 17A and FIG. 17B is 1 to 10 and the step slope may be ±10%/loop to ±50%/loop, preferably ±10%/loop to ±30%/loop. The gradient slopes of the gradient regions in FIG. 17A and FIG. 17B are, for example, 10%/nm to 50%/nm and −10%/nm to −50%/nm. The thickness of the barrier layer 108 is, for example, 1 nm to 50 nm, preferably 1 nm to 30 nm; and the thickness of the intermediate layer 106 is, for example, 1 nm to 20 nm, preferably 1 nm to 10 nm.

Based on the above, in the invention, the intermediate layer disposed between the channel layer and the barrier layer has a specific aluminum content variation, such as a continuously varying aluminum content between the interfaces, so as to increase electron mobility and increase carrier limitation capability to improve 2DEG characteristics while improving the interface quality and surface roughness of the epitaxial structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An epitaxial structure, comprising:
   a substrate;
   a buffer layer disposed on the substrate;
   a channel layer disposed on the buffer layer;
   a barrier layer disposed on the channel layer, wherein a chemical composition of the barrier layer is $Al_{x1}In_{y1}Ga_{z1}N$, and $x1+y1+z1=1$, $0 \leq x1 \leq 0.3$, and $0.3 \leq y1 \leq 0.7$; and
   an intermediate layer disposed between the channel layer and the barrier layer, wherein a chemical composition of the intermediate layer is $Al_{x2}In_{y2}Ga_{z2}N$, and $x2+y2+z2=1$, $0.5 \leq x2 \leq 1$, and $0 \leq y2 \leq 0.5$, wherein an aluminum content of at least a portion of the intermediate layer is greater than an aluminum content of the barrier layer, and a lattice constant of the barrier layer is greater than a lattice constant of the intermediate layer.

2. The epitaxial structure of claim 1, wherein the aluminum content of the barrier layer is a fixed value, and the aluminum content of the barrier layer is 10% to 30%.

3. The epitaxial structure of claim 2, wherein the aluminum content of the intermediate layer is a fixed value, and the aluminum content of the intermediate layer is greater than 30%.

4. The epitaxial structure of claim 2, wherein the aluminum content of the intermediate layer is linearly reduced along a growth direction of the epitaxial structure, and an initial content of the aluminum content of the intermediate layer is 50% to 100%, an end content thereof is 10% to 50%, and a gradient slope thereof is −10%/nm to −50%/nm.

5. The epitaxial structure of claim 2, wherein the aluminum content of the intermediate layer is linearly increased along a growth direction of the epitaxial structure, and an initial content of the aluminum content of the intermediate layer is 0% to 50%, an end content thereof is 50% to 100%, and a gradient slope thereof is 10%/nm to 50%/nm.

6. The epitaxial structure of claim 2, wherein the aluminum content of the intermediate layer is increased stepwise along a growth direction of the epitaxial structure, and an initial content of the aluminum content of the intermediate layer is 0% to 50%, an end content thereof is 50% to 100%, and a step slope thereof is 10%/loop to 50%/loop.

7. The epitaxial structure of claim 2, wherein the aluminum content of the intermediate layer is reduced stepwise along a growth direction of the epitaxial structure, and an initial content of the aluminum content of the intermediate layer is 50% to 100%, an end content thereof is 0% to 50%, and a step slope thereof is −10%/loop to −50%/loop.

8. The epitaxial structure of claim 2, wherein along a growth direction of the epitaxial structure, the aluminum content of the intermediate layer is composed of alternating fixed regions and gradient regions, aluminum contents of the fixed regions are fixed values, and aluminum content of the gradient regions are linearly increased, wherein an initial content of the aluminum content of the intermediate layer is 0% to 50%, an end content thereof is 50% to 100%, a gradient slope of the aluminum contents of the gradient regions is 10%/nm to 50%/nm, and a step slope of the fixed regions is 10%/loop to 50%/loop.

9. The epitaxial structure of claim 2, wherein along a growth direction of the epitaxial structure, the aluminum content of the intermediate layer is composed of alternating fixed regions and gradient regions, aluminum contents of the fixed regions are fixed values, and aluminum contents of the gradient regions are linearly reduced, wherein an initial content of the aluminum content of the intermediate layer is 50% to 100%, an end content thereof is 0% to 50%, a gradient slope of the aluminum contents of the gradient regions is −10%/nm to −50%/nm, and a step slope of the fixed regions is −10%/loop to −50%/loop.

10. The epitaxial structure of claim 2, wherein along a growth direction of the epitaxial structure, the aluminum content of the intermediate layer is composed of a plurality of fixed regions, and aluminum contents of adjacent fixed regions are different fixed values, wherein a lower of the aluminum contents in the fixed regions is 0% to 50%, a higher thereof is 50% to 100%, and a step slope of the fixed regions is ±10%/loop to ±50%/loop.

11. The epitaxial structure of claim 2, wherein along a growth direction of the epitaxial structure, the aluminum content of the intermediate layer is composed of a plurality of fixed regions and a plurality of gradient regions, each of the gradient regions is disposed between two of the fixed regions, and aluminum contents of two adjacent fixed regions of each of the gradient regions are different fixed values, wherein a lower of the aluminum contents in the fixed regions is 0% to 50% and a higher thereof is 50% to 100%, a step slope of the fixed regions is ±10%/loop to ±50%/loop, and gradient slopes of the gradient regions are 10%/nm to 50%/nm and −10%/nm to −50%/nm.

12. The epitaxial structure of claim 1, wherein the aluminum content of the barrier layer is linearly reduced along a growth direction of the epitaxial structure, and an initial content of the aluminum content of the barrier layer is 10% to 50%, an end content thereof is 0% to 20%, and a gradient slope thereof is −1%/nm to −20%/nm.

13. The epitaxial structure of claim 12, wherein the aluminum content of the intermediate layer is linearly increased along a growth direction, and an initial content of the aluminum content of the intermediate layer is 0% to 50%, an end content thereof is 50% to 100%, and a gradient slope thereof is 10%/nm to 50%/nm.

14. The epitaxial structure of claim 12, wherein the aluminum content of the intermediate layer is increased stepwise along a growth direction, and an initial content of the aluminum content of the intermediate layer is 0% to 50%, an end content thereof is 50% to 100%, and a step slope thereof is 10%/loop to 50%/loop.

15. The epitaxial structure of claim 12, wherein the aluminum content of the intermediate layer is reduced stepwise along a growth direction, and an initial content of the aluminum content of the intermediate layer is 50% to 100%, an end content thereof is 0% to 50%, and a step slope thereof is −10%/loop to −50%/loop.

16. The epitaxial structure of claim 12, wherein along a growth direction, the aluminum content of the intermediate layer is composed of alternating fixed regions and gradient regions, aluminum contents of the fixed regions are fixed values, and aluminum contents of the gradient regions are linearly increased, wherein an initial content of the aluminum content of the intermediate layer is 0% to 50%, an end content thereof is 50% to 100%, a gradient slope of the aluminum contents of the gradient regions is 10%/nm to 50%/nm, and a step slope of the fixed regions is 10%/loop to 50%/loop.

17. The epitaxial structure of claim 12, wherein along a growth direction, the aluminum content of the intermediate layer is composed of alternating fixed regions and gradient regions, aluminum contents of the fixed regions are fixed values, and aluminum contents of the gradient regions are linearly reduced, wherein an initial content of the aluminum content of the intermediate layer is 50% to 100%, an end content thereof is 0% to 50%, a gradient slope of the aluminum contents of the gradient regions is −10%/nm to −50%/nm, and a step slope of the fixed regions is −10%/loop to −50%/loop.

18. The epitaxial structure of claim 12, wherein along a growth direction, the aluminum content of the intermediate layer is composed of a plurality of fixed regions, and aluminum contents of adjacent fixed regions are different fixed values, wherein a lower of the aluminum contents in the fixed regions is 0% to 50%, a higher thereof is 50% to 100%, and a step slope of the fixed regions is ±10%/loop to ±50%/loop.

19. The epitaxial structure of claim 12, wherein along a growth direction, the aluminum content of the intermediate layer is composed of a plurality of fixed regions and a plurality of gradient regions, each of the gradient regions is disposed between two of the fixed regions, and aluminum contents of two adjacent fixed regions of each of the gradient regions are different fixed values, wherein a lower of the aluminum contents in the fixed regions is 0% to 50% and a higher thereof is 50% to 100%, a step slope of the fixed regions is ±10%/loop to ±50%/loop, and gradient slopes of the gradient regions are 10%/nm to 50%/nm and −10%/nm to −50%/nm.

20. The epitaxial structure of claim 1, wherein a roughness (rms) of a surface of the intermediate layer in contact with the barrier layer is less than 5 nm.

21. The epitaxial structure of claim 1, further comprising a nucleation layer disposed between the substrate and the buffer layer.

* * * * *